United States Patent
Mandelli

(10) Patent No.: US 8,902,343 B1
(45) Date of Patent: Dec. 2, 2014

(54) CHARGE PUMP FOR PIXEL FLOATING DIFFUSION GAIN CONTROL

(71) Applicant: AltaSens, Inc., Westlake Village, CA (US)

(72) Inventor: Emanuele Mandelli, Los Angeles, CA (US)

(73) Assignee: AltaSens, Inc., Westlake Village, CA (US)

( * ) Notice: Subject to any disclaimer, the term of this patent is extended or adjusted under 35 U.S.C. 154(b) by 42 days.

(21) Appl. No.: 13/926,292

(22) Filed: Jun. 25, 2013

(51) Int. Cl.
*H04N 5/335* (2011.01)

(52) U.S. Cl.
USPC ........................................ 348/308; 250/208.1

(58) Field of Classification Search
CPC .................................................... H04N 5/2353
USPC ................................ 348/308, 294; 250/208.1
See application file for complete search history.

(56) References Cited

U.S. PATENT DOCUMENTS

| | | | |
|---|---|---|---|
| 5,461,425 A | 10/1995 | Fowler et al. | |
| 6,246,436 B1 | 6/2001 | Lin et al. | |
| 7,183,531 B2 * | 2/2007 | Olsen et al. | 250/208.1 |
| 2007/0023786 A1 | 2/2007 | Johnson et al. | |
| 2008/0186394 A1 * | 8/2008 | Panicacci | 348/308 |
| 2011/0149136 A1 * | 6/2011 | Johnson | 348/308 |
| 2012/0273651 A1 | 11/2012 | Willassen | |

* cited by examiner

*Primary Examiner* — Tuan Ho
(74) *Attorney, Agent, or Firm* — Medley, Behrens & Lewis, LLC

(57) ABSTRACT

Various technologies described herein pertain to controlling floating diffusion gain using a charge pump. Feedback can be utilized to control impedance of a floating diffusion region of a pixel of an image sensor, which further includes a read bus and an amplifier. The pixel includes a capacitor and a floating diffusion region, which has an intrinsic floating diffusion capacitance. The capacitor includes a first terminal and a second terminal, where the first terminal is coupled to the floating diffusion region. The amplifier includes an input terminal and an output terminal. The input terminal of the amplifier is coupled to the read bus and the output terminal of the amplifier is coupled to the second terminal of the capacitor. Gain of the amplifier is adjustable to control an equivalent capacitance of the floating diffusion region. Alteration of the equivalent capacitance can modify conversion gain and dynamic range of the pixel.

20 Claims, 9 Drawing Sheets

CHARGE PUMP FOR PIXEL FLOATING DIFFUSION GAIN CONTROL

BACKGROUND

An image sensor is a device that can convert an optical image into an electronic signal. Image sensors are oftentimes utilized in still cameras, video cameras, video systems, and other imaging devices. Cameras and other imaging devices commonly employ either a charge-coupled device (CCD) image sensor or a complementary metal-oxide-semiconductor (CMOS) image sensor.

CMOS image sensors include an array of pixels, each of which can comprise a photodetector. CMOS image sensors also include circuitry to convert light energy to an analog voltage. Moreover, CMOS image sensors can include additional circuitry to convert the analog voltage to digital data. Thus, a CMOS image sensor can be an integrated circuit that comprises various analog, digital, mixed-signal, etc. components associated with capturing light and processing imaging related information; accordingly, a CMOS image sensor can be a system on chip (SoC). For example, components integrated into the CMOS image sensor oftentimes include a processor module (e.g., microprocessor, microcontroller, or digital signal processor (DSP) core), memory, analog interfaces (e.g., analog to digital converters, digital to analog converters), and so forth.

Visible imaging systems implemented using CMOS image sensors can reduce costs, power consumption, and noise while improving resolution. For instance, cameras can use CMOS image sensors that efficiently marry low-noise image detection and signal processing with multiple supporting blocks that can provide timing control, clock drivers, reference voltages, analog to digital conversion, digital to analog conversion, key signal processing elements, and the like. High-performance video cameras can thereby be assembled using a single CMOS integrated circuit supported by few components including a lens and a battery, for instance. Accordingly, by leveraging CMOS image sensors, camera size can be decreased and battery life can be increased. Also, dual-use cameras have emerged that can employ CMOS image sensors to alternately produce high-resolution still images or high definition (HD) video.

In a pixel of an image sensor, charge collected in a photodetector is commonly transferred to a floating diffusion region of the pixel. The floating diffusion region can convert the charge to a voltage. Capacitance of the floating diffusion region can determine a voltage gain. For example, a low capacitance of the floating diffusion region can provide a high conversion gain, which can be used for low light scenes. Yet, high conversion gain can be associated with a low dynamic range, particularly in designs with larger pixels. According to another example, a larger capacitance of the floating diffusion region can provide a lower conversion gain, while allowing for a greater dynamic range. However, the capacitance of the floating diffusion region is typically selected during design of the image sensor; accordingly, the conversion gain and the dynamic range of a pixel is typically fixed due to the capacitance of the floating diffusion region being fixed based upon the design of the image sensor.

SUMMARY

Described herein are various technologies that pertain to controlling floating diffusion gain using a charge pump. Feedback can be utilized to control impedance of a floating diffusion region of a pixel of an image sensor. According to various embodiments, the image sensor can include a read bus, a pixel array including the pixel, and an amplifier. The pixel can include a photodetector, a floating diffusion region, a source follower transistor, a select transistor, and a capacitor. The photodetector can convert optical energy to electrical charge, and the floating diffusion region can receive the electrical charge from the photodetector. Further, the floating diffusion region has an intrinsic floating diffusion capacitance. Moreover, the source follower transistor can be coupled to the floating diffusion region. Additionally, the select transistor can be coupled to the source follower transistor and the read bus. The capacitor can include a first terminal and a second terminal, where the first terminal can be coupled to the floating diffusion region. Further, the amplifier of the image sensor can include an input terminal and an output terminal. The input terminal of the amplifier can be coupled to the read bus and the output terminal of the amplifier can be coupled to the second terminal of the capacitor. A gain of the amplifier can be adjusted to control an equivalent capacitance of the floating diffusion region of the pixel. Alteration of the equivalent capacitance of the floating diffusion region can modify conversion gain and dynamic range of the pixel.

In accordance with various embodiments, conversion gain of a pixel included in a pixel array of an image sensor can be controlled. A gain of an amplifier included in the image sensor can be set. For instance, the gain of the amplifier can be adjustable. Moreover, the amplifier can include an input terminal coupled to a read bus of the image sensor and an output terminal coupled to a capacitor included in the pixel. The capacitor can be further coupled to a floating diffusion region of the pixel. Moreover, optical energy can be collected with the pixel. The optical energy can be converted by the pixel to a voltage based upon the conversion gain, where the conversion gain can be a function of the gain of the amplifier. Further, the voltage can be output via the read bus.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
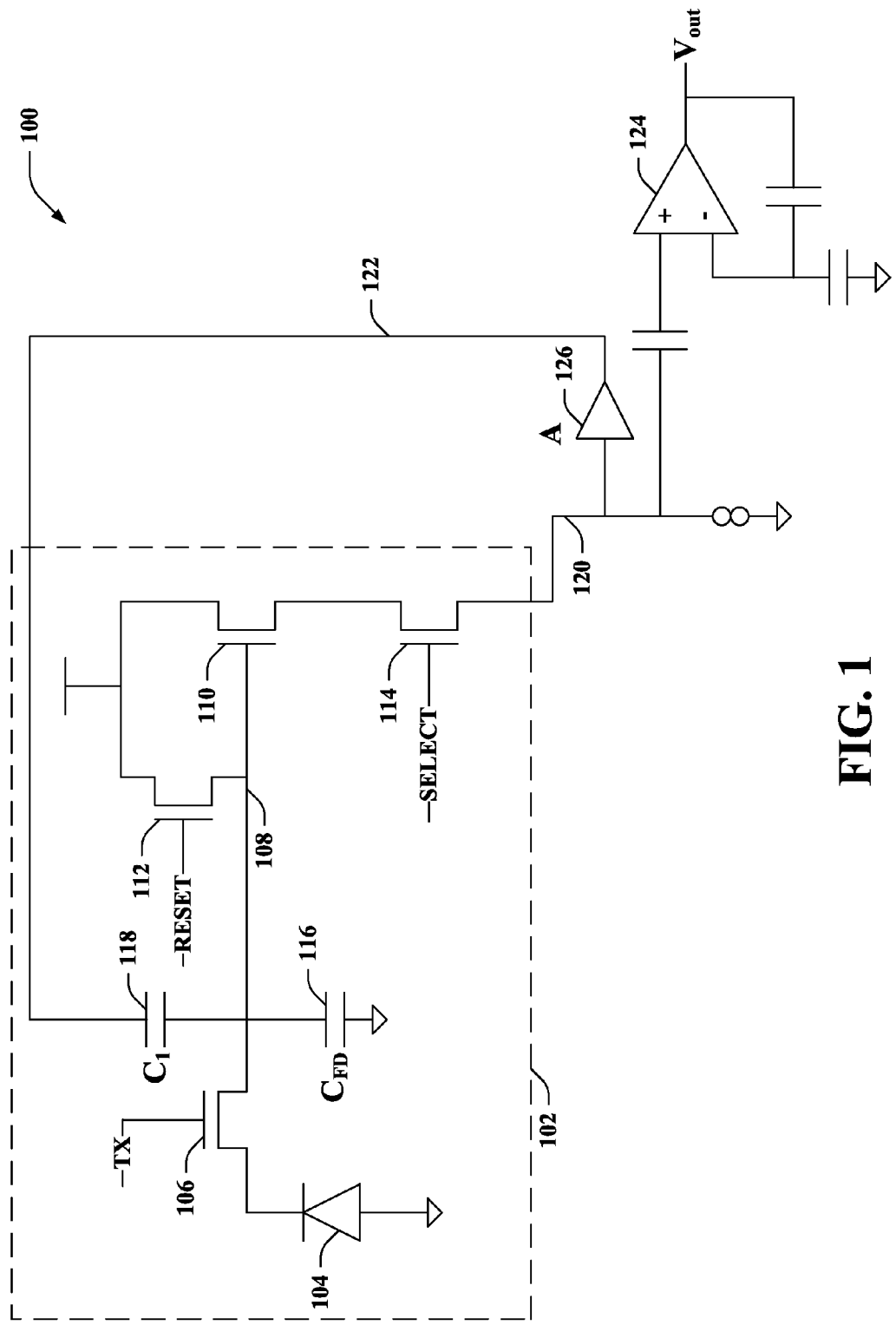
FIG. 1 illustrates a portion of an exemplary image sensor.

Various technologies pertaining to controlling floating diffusion gain of a pixel of an image sensor using a charge pump are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As set forth herein, an image sensor can control floating diffusion gain using a charge pump. More particularly, feedback can be employed to control impedance of a floating diffusion region of a pixel. For instance, the image sensor can enable capacitive feedback to be selected at a time of operation. Floating diffusion capacitance can determine the conversion from photo-generated electrons to voltage. By way of example, a high conversion gain can be beneficial for signal-to-noise (SNR) as noise sources are often topologically located after the floating diffusion region. Yet, high conversion gain may detrimentally impact floating diffusion dynamic range as fewer electrons can saturate such node.

Referring now to the drawings, FIG. 1 illustrates a portion of an exemplary image sensor 100. The image sensor 100, for instance, can be a CMOS image sensor system on chip. The portion of the image sensor 100 depicted in FIG. 1 includes a pixel 102. The pixel 102 can be included in a pixel array (not shown) of the image sensor 100. The pixel 102 shown in FIG. 1 is a 4T pixel cell (e.g., the pixel 102 includes four transistors); yet, it is contemplated that other types of pixel cells are intended to fall within the scope of the hereto appended claims (e.g., 3T pixel cell, 5T pixel cell, 6T pixel cell, etc.). The image sensor 100 can actively control conversion gain of the pixel 102.

The pixel includes a photodetector 104 that converts optical energy to electrical charge. The photodetector 104 can be a photogate, a photoconductor, a photodiode, or the like. Moreover, the photodetector 104 can overlay a substrate to generate a photo-generated charge. For instance, the photodetector 104 can have sensitivity to a particular type of incident light (e.g., red light, blue light, green light); yet, it is to be appreciated that the claimed subject matter is not so limited.

The pixel 102 further includes a transfer transistor 106, a source follower transistor 110, a reset transistor 112, and a select transistor 114. In the pixel 102, the photodetector 104 is coupled to a transfer transistor 106. The transfer transistor 106 is further coupled to a floating diffusion region 108. The floating diffusion region 108 is coupled to the source follower transistor 110 and the reset transistor 112. The source follower transistor 110 is further coupled to the select transistor 114. According to an example, a gate of the source follower transistor 110 can be coupled to the floating diffusion region 108, and a source of the source follower transistor 110 can be coupled to a drain of the select transistor 114.

As noted above, the pixel 102 illustrated in FIG. 1 is a 4T pixel cell. Accordingly, the pixel 102 includes the transfer transistor 106 coupled to the photodetector 104 and the floating diffusion region 108. According to another example, a 3T pixel cell need not include the transfer transistor 106; such 3T pixel cell is intended to fall within the scope of the hereto appended claims. Moreover, pixel cells that include more than four transistors (e.g., 5T pixel cell, 6T pixel cell, etc.) are likewise intended to fall within the scope of the hereto appended claims.

The floating diffusion region 108 of the pixel 102 has an intrinsic floating diffusion capacitance 116. A value of the intrinsic floating diffusion capacitance 116 is represented as $C_{FD}$. The intrinsic floating diffusion capacitance 116 is an initial, fixed capacitance of the floating diffusion region 108. The value of the intrinsic floating diffusion capacitance 116, $C_{FD}$, for instance, can be based upon a design of the pixel 102 (or the image sensor 100).

The pixel 102 further includes a capacitor 118. A value of the capacitance of the capacitor 118 is represented as $C_1$. The capacitor 118 includes a first terminal and a second terminal. The first terminal of the capacitor 118 is coupled to the floating diffusion region 108 of the pixel 102. According to an example, the capacitor 118 can be a metal-to-metal parasitic capacitor. However, other types of capacitors are intended to fall within the scope of the hereto appended claims.

According to an example, the value of the capacitor 118 ($C_1$) and the intrinsic floating diffusion capacitance 116 ($C_{FD}$) can be on the same order of magnitude. Pursuant to an illustration, $C_1$ and $C_{FD}$ can each be on the order of 1 fF. It is contemplated that $C_1$ and $C_{FD}$ can be substantially similar; however, the claimed subject matter is not so limited as it is to be appreciated that $C_1$ can differ from $C_{FD}$.

Moreover, the portion of the image sensor 100 illustrated in FIG. 1 includes a read bus 120 and a feedback bus 122. The select transistor 114 of the pixel 102 is coupled to the read bus 120. Further, the second terminal of the capacitor 118 of the pixel 102 is coupled to the feedback bus 122. According to an example, although not shown, it is contemplated that the read bus 120 can be coupled to select transistors of disparate pixels in the same column as the pixel 102 (or a subset of such disparate pixels in the same column) within the pixel array of the image sensor 100. Additionally or alternatively, although not shown, it is to be appreciated that the feedback bus 122 can be coupled to capacitors of the disparate pixels in the same column as the pixel 102 (or a subset of such disparate pixels in the same column) within the pixel array of the image sensor 100.

A select signal can be employed to select a particular row of pixels from the pixel array from which to read out values. For instance, when reading out values from the row of pixels that includes the pixel 102, the select signal can be received at a gate of the select transistor 114 to read out a value from the floating diffusion region 108 of the pixel 102.

According to an illustration, the floating diffusion region 108 can be reset to a known state before transfer of charge to the floating diffusion region 108. Resetting of the floating diffusion region 108 can be effectuated by the reset transistor 112. For example, a reset signal can be received at a gate of the reset transistor 112 to cause resetting of the floating diffusion region 108. Further, the transfer transistor 106 can transfer charge (e.g., provided by the photodetector 104) to the floating diffusion region 108. The charge can be transferred based upon a transfer signal (TX) received at a gate of the transfer transistor 106. Light can be integrated at the photodetector 104 and electrons generated from the light can be transferred to the floating diffusion region 108 (e.g., in a noiseless or substantially noiseless manner) when the TX is received at the transfer transistor 106. Moreover, the pixel 102 (along with other pixels in the same row of the pixel array) can be selected for readout based upon the select signal provided to the gate of the select transistor 114. Readout can be effectuated via the read bus 120. Further, the source follower transistor 110 can output and/or amplify a signal representing a reset voltage and/or a pixel signal voltage based on the photoconverted charges.

The read bus 120 can carry content (e.g., sampled signal) from the pixel 102 to a column buffer 124 of the image sensor 100. The column buffer 124 can amplify (e.g., condition) the signal from the pixel 102 (as well as the disparate pixels in the column when values from the disparate pixels are similarly read out). The column buffer 124 can enable low noise readout and can condition the signal from the pixel 102 positioned at a row in the column corresponding to the column buffer 124.

After processing, the column buffer 124 can provide an output value, $V_{out}$. The output value, $V_{out}$, from the column buffer 124, for instance, can be retained. For example, although not shown, the column buffer 124 can be associated with circuitry such as a capacitor and switch, which can sample and hold the output value, $V_{out}$, yielded from the column buffer 124. By way of illustration, the capacitor can be loaded with the output value, $V_{out}$, from the column buffer 124. Further, the switch can be closed to allow for connecting to a bus (not shown). The bus can enable communicating the output value, $V_{out}$, to an analog to digital converter (ADC). The ADC can digitize the sampled signal to yield a digital signal. The digital signal can thereafter be provided to disparate components (not shown) for further processing, manipulation, storage, display, and so forth.

The image sensor 100 further includes an amplifier 126. The amplifier 126 includes an input terminal and an output terminal. The input terminal of the amplifier 126 is coupled to the read bus 120. The output terminal of the amplifier 126 is coupled to the second terminal of the capacitor 118 (e.g., via the feedback bus 122). The amplifier 126 can have an adjustable gain; the gain of the amplifier 126 is represented as A. The gain of the amplifier 126 can be adjusted to provide dynamic control of a conversion gain of the pixel 102.

An equivalent capacitance ($C_{eq}$) of the floating diffusion region 108 can be electrically variable utilizing a pixel-level charge pump controlled by the amplifier 126. The equivalent capacitance of the floating diffusion region 108 can be a function of the capacitance of the capacitor 118 ($C_1$), the intrinsic floating diffusion capacitance 116 ($C_{FD}$), and the gain of the amplifier 126 (A). It is contemplated that the capacitance of the capacitor 118 ($C_1$) and the intrinsic floating diffusion capacitance 116 ($C_{FD}$) can be fixed, while the gain of the amplifier 126 (A) can be adjustable. Thus, the equivalent capacitance of the floating diffusion region 108 can vary as a function of the gain of the amplifier 126 (A). According to an example, the equivalent capacitance of the floating diffusion region 108 can be changeable in a range between a low capacitance and a high capacitance. The low capacitance can be below the intrinsic floating diffusion capacitance 116 (e.g. less than $C_{FD}$) and the high capacitance can be above the intrinsic floating diffusion capacitance 116 (e.g., greater than $C_{FD}$). Further, the range of the equivalent capacitance can be a function of the range of the gain of the amplifier 126 (A).

Inclusion of the amplifier 126, the feedback bus 122, and the capacitor 118 in the image sensor 100 provides a feedback loop from the read bus 120 to the pixel 102 that provides feedback to control the equivalent capacitance of the floating diffusion region 108 of the pixel 102. The gain of the amplifier 126 (A) can be changed to control the equivalent capacitance of the floating diffusion region 108 of the pixel 102. More particularly, it is contemplated that the gain of the amplifier 126 can be adjusted dynamically, which can cause corresponding alteration of the equivalent capacitance of the floating diffusion region 108.

According to an example, the amplifier 126 can be a column-based feedback amplifier. The amplifier 126 can be column-based if one row from the pixel array of the image sensor 100 is read out at a particular time, for instance. Following this example, other floating diffusion regions of other pixels in the column can be kept in reset, while the floating diffusion region 108 is read out at the particular time.

Figure 2:
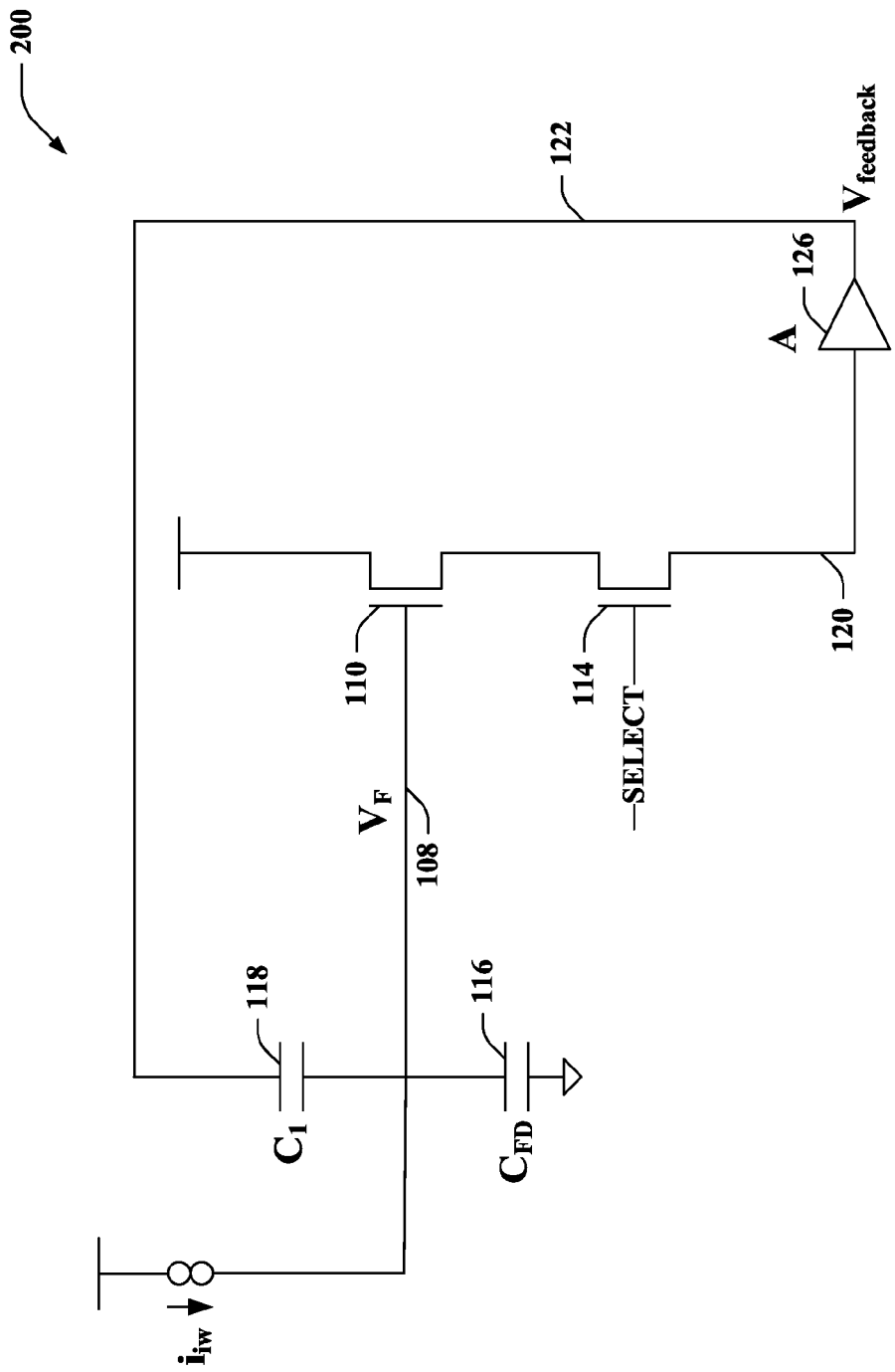
FIG. 2 illustrates an exemplary representation of a part of the image sensor shown in FIG. 1.

With reference to FIG. 2, illustrated is an exemplary representation 200 of a part of the image sensor 100 shown in FIG. 1. The equivalent capacitance of the floating diffusion region 108, $C_{eq}$, can be approximated by:

$$C_{eq}=[C_{FD}-C_1(A-1)]$$

In view of the foregoing, the equivalent capacitance of the floating diffusion region 108, $C_{eq}$, can be adjusted to be greater than, equal to, or less than the intrinsic floating diffusion capacitance, $C_{FD}$, based upon the gain of the amplifier 126, A. For example, if the gain of the amplifier 126, A, is approximately 1, then the equivalent capacitance of the floating diffusion region 108 can approximately equal the intrinsic floating diffusion capacitance, $C_{FD}$. Further, if the gain of the amplifier 126, A, is less than 1, then the equivalent capacitance of the floating diffusion region 108 can be greater than the intrinsic floating diffusion capacitance, $C_{FD}$. Moreover, if the gain of the amplifier 126, A, is greater than 1, then the equivalent capacitance of the floating diffusion region 108 can be less than the intrinsic floating diffusion capacitance, $C_{FD}$.

Figure 3:
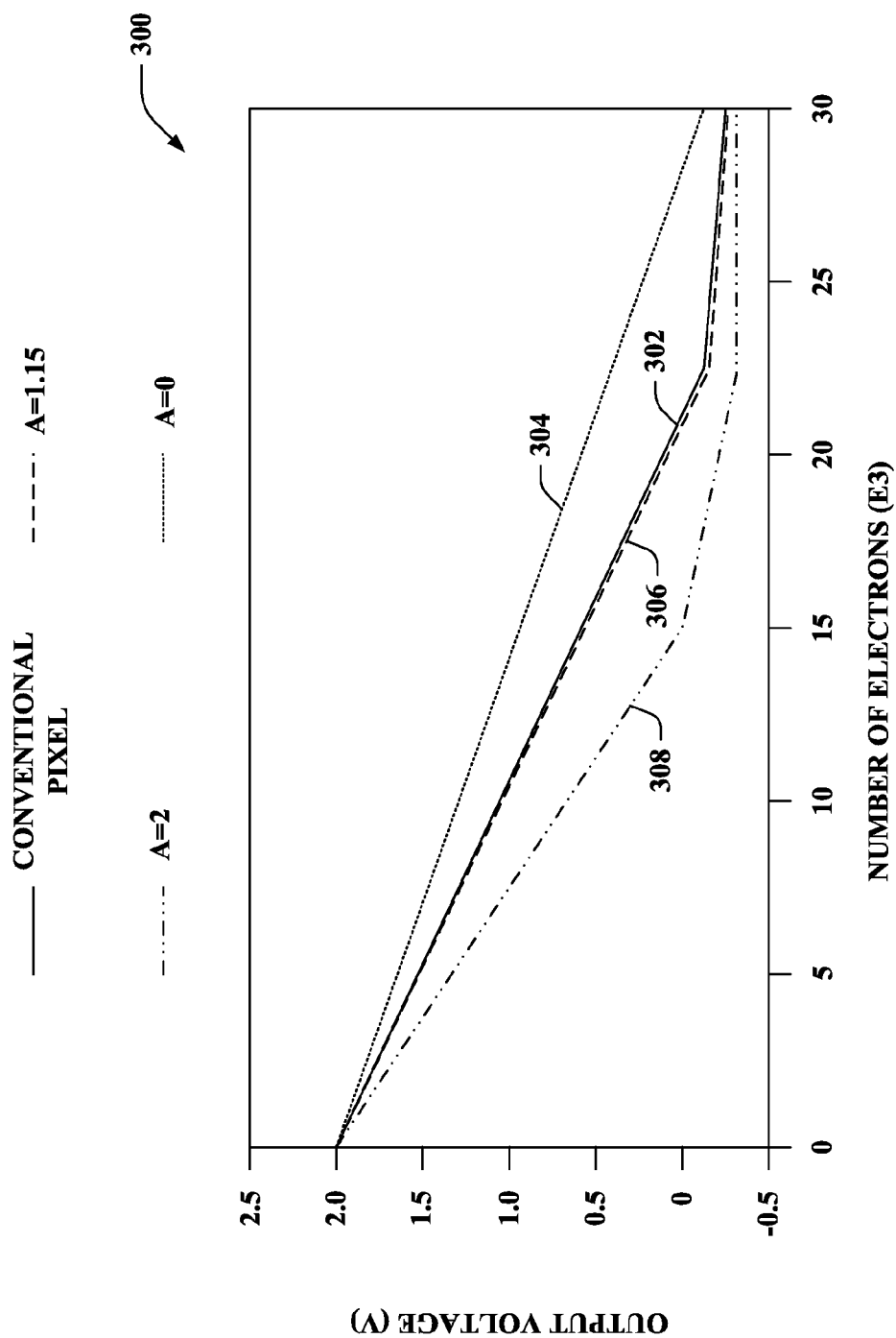
FIG. 3 illustrates an exemplary graph depicting simulations of operation of the image sensor of FIG. 1 with differing gains of an amplifier, A.

Turning to FIG. 3, illustrated is an exemplary graph 300 depicting simulations of operation of the image sensor 100 of FIG. 1 with differing gains of the amplifier 126, A. In FIG. 3, the x-axis represents a number of electrons and the y-axis represents an output voltage. The number of electrons can correspond to brightness of light; the brightness increases as the number of electrons increases. Moreover, the output voltage can decrease as an object becomes brighter.

The simulations depicted in the graph 300 include curves corresponding to three different gains for the amplifier 126, A, as well as a curve corresponding to a conventional pixel (without the feedback described herein). It is to be appreciated, however, that substantially any other gain of the amplifier 126, A, can be utilized, and thus, the claimed subject matter is not limited to the examples described in connection with FIG. 3

As shown in the graph 300, curve 302 corresponds to operation of a conventional pixel, while curve 304, curve 306, and curve 308 correspond to operation of a pixel (e.g., the pixel 102 of FIG. 1) with differing gains of the amplifier 126, A. More particularly, the curve 304 corresponds to the gain of the amplifier 126 being set to 0 (A=0), the curve 306 corresponds to the gain of the amplifier 126 being set to 1.15 (A=1.15), and the curve 308 corresponds to the gain of the amplifier 126 being set to 2 (A=2).

As illustrated, the curve 302 and the curve 306 can be substantially overlapping. Accordingly, with the gain of the amplifier 126 being set to 1.15 (represented by the curve 306), the equivalent capacitance of the floating diffusion region 108 can be substantially similar to the intrinsic floating diffusion capacitance 116 ($C_{FD}$) of the floating diffusion region 108.

Further, with the gain of the amplifier 126 being set to 0 (represented by the curve 304), a lower conversion gain can result (relative to when the gain is set to 1.15 or the conventional pixel) due to the floating diffusion region 108 additionally being loaded by the capacitor 118. The gain being set to 0 can also increase the dynamic range in comparison to when the gain is set to a higher value than 0 or for the conventional pixel. For instance, the higher dynamic range can be beneficial for a sunny, outdoor scene.

Moreover, with the gain of the amplifier 126 set to 2 (represented by the curve 308), a higher conversion gain can result due to the lower equivalent capacitance of the floating diffusion region 108 (relative to when the gain is set to 1.15 or the conventional pixel). While providing the higher conversion gain, the pixel can be less dynamic (e.g., decreased dynamic range) when the gain is set to 2 in comparison to when the gain is set to a lower value than 2 or for the conventional pixel. For instance, the higher conversion gain for the pixel 102 can be beneficial for a low-light scene.

Figure 4:
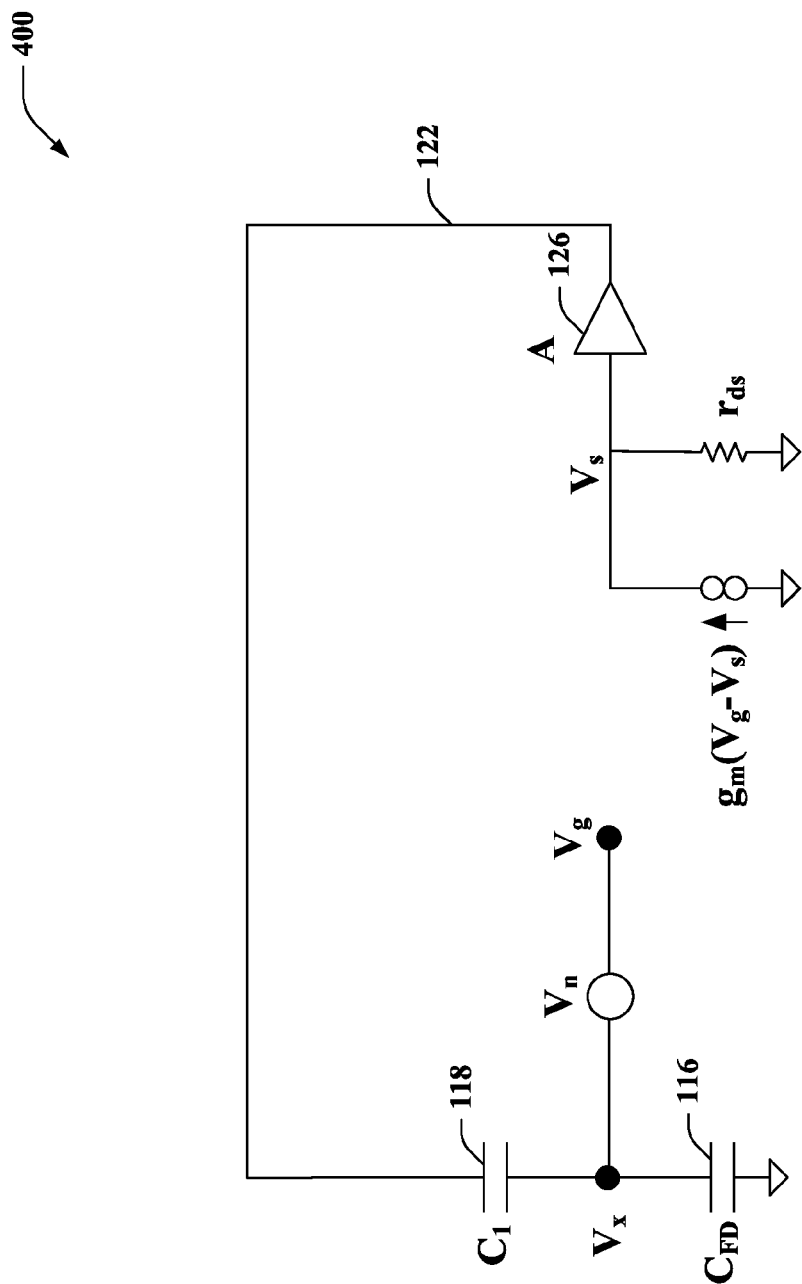
FIG. 4 illustrates another exemplary representation of a part of the image sensor shown in FIG. 1.

Referring to FIG. 4, illustrated is another exemplary representation 400 of a part of the image sensor 100 shown in FIG. 1. Noise introduced by the feedback loop of FIG. 1 can be calculated as follows:

$$\frac{V_s}{V_n} = g_m r_{ds} \cdot \frac{1}{1 + g_m r_{ds} \cdot \left(1 - A \cdot \frac{C_1}{C_1 + C_{FD}}\right)}$$

In the foregoing, $V_n$ represents a voltage source at the gate of the source follower transistor 110 and $V_s$ represents an output noise. Moreover, $g_m$ represents the transconductance of the source follower transistor 110 and $r_{ds}$ represents the channel resistance of the source follower transistor 110. Accordingly, the signal-to-noise ratio can be a function of the gain of the amplifier 126, A.

Figure 5:
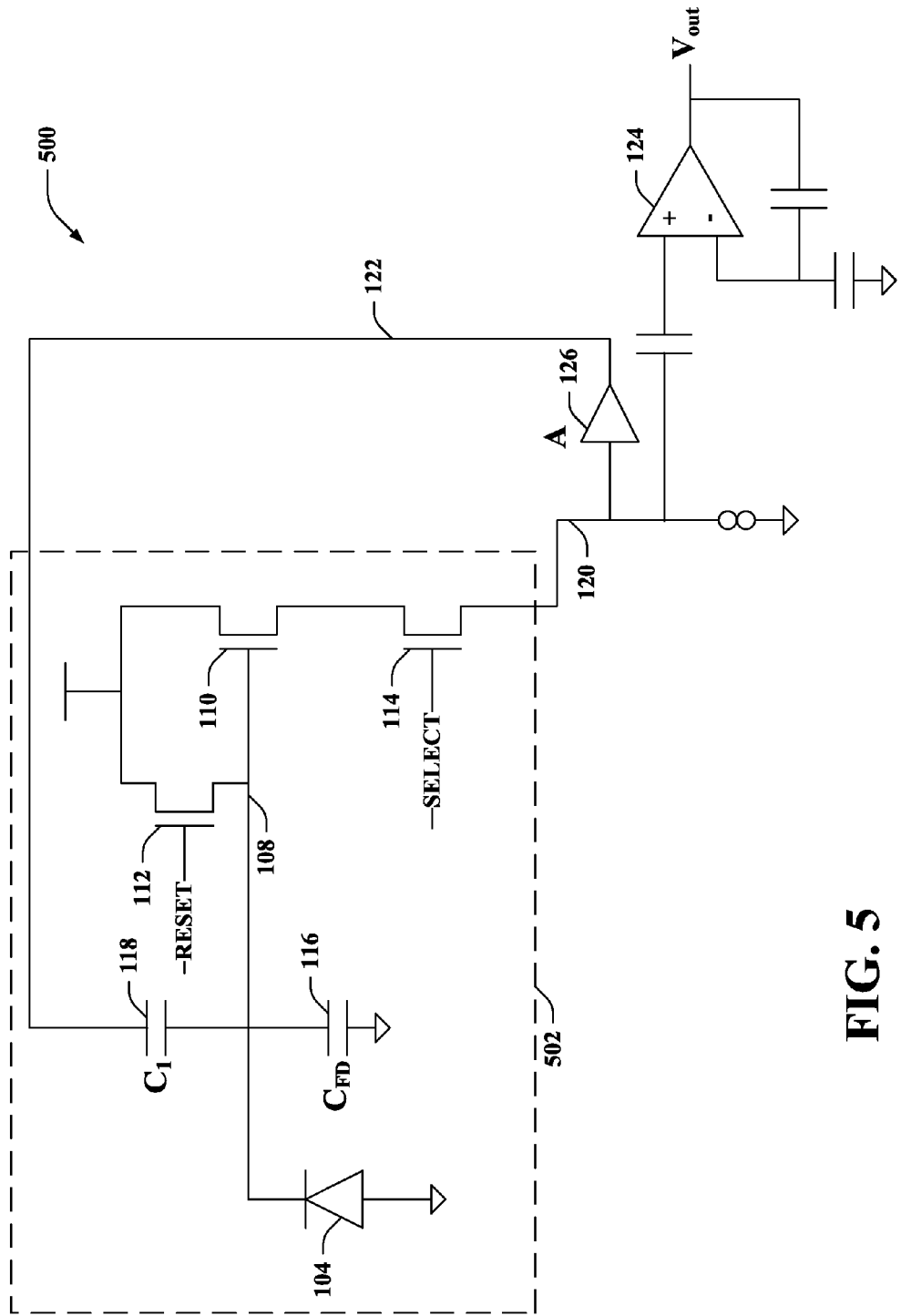
FIG. 5 illustrates a portion of another exemplary image sensor.

With reference to FIG. 5, illustrated is a portion of another exemplary image sensor 500. Again, the image sensor 500, for instance, can be a CMOS image sensor system on chip. The portion of the image sensor 500 depicted in FIG. 5 includes a pixel 502. The pixel 502 can be included in a pixel array (not shown) of the image sensor 500. The pixel 502 shown in FIG. 5 is a 3T pixel cell (e.g., the pixel 502 includes three transistors).

Similar to the pixel 102 of FIG. 1, the pixel 502 can include the photodetector 104, the floating diffusion region 108, the source follower transistor 110, the select transistor 114, the reset transistor 112, and the capacitor 118. In the example set forth in FIG. 5, the photodetector 104 is coupled to the floating diffusion region 108 (e.g., without the transfer transistor 106 of FIG. 1). Although not shown, it is contemplated that other pixel configurations are intended to fall within the scope of the hereto appended claims. For instance, differing pixel configurations that include more than four transistors are contemplated; yet, it is to be appreciated that the claimed subject matter is not so limited.

Figure 6:
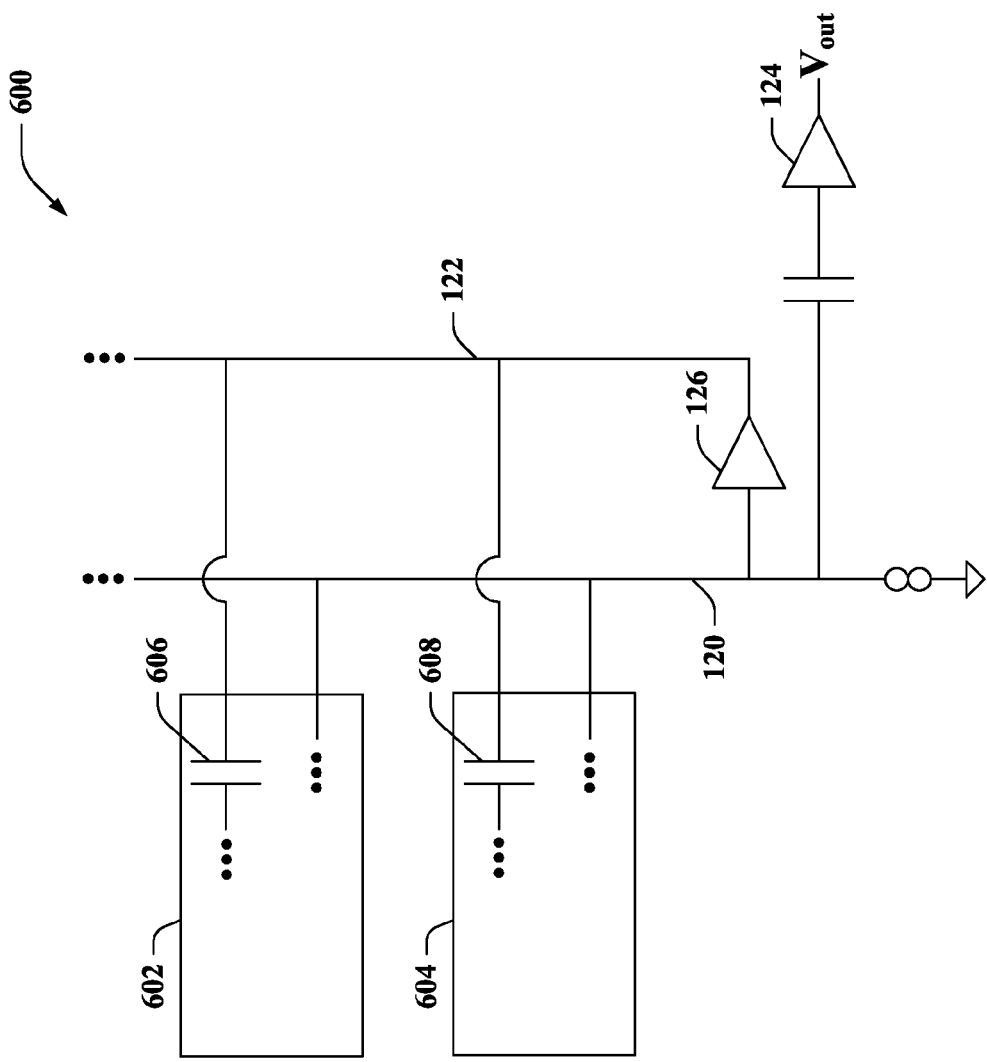
FIG. 6 illustrates a portion of an exemplary image sensor that employs a shared amplifier for a plurality of pixels in a column of a pixel array.

With reference to FIG. 6, illustrated is a portion of an exemplary image sensor 600 that employs a shared amplifier for a plurality of pixels in a column of a pixel array. The image sensor 600 includes a first pixel 602 and a second pixel 604 of a pixel array (not shown). The first pixel 602 and the second pixel 604 are in the same column of pixel array of the image sensor 600 (e.g., the first pixel 602 and the second pixel 604 can be adjacent to each other, separate by other pixels in the pixel array). According to an example, the first pixel 602 and the second pixel 604 can each be substantially similar to the pixel 102 of FIG. 1. By way of another example, the first pixel 602 and the second pixel 604 can each be substantially similar to the pixel 502 of FIG. 5. Yet, as noted herein, it is contemplated that other types of pixel cells are intended to fall within the scope of the hereto appended claims.

The first pixel 602 includes a capacitor 606. The capacitor 606 further includes a first terminal and a second terminal. The first terminal of the capacitor 606 is coupled to a floating diffusion region (not shown) of the first pixel 602 and the second terminal of the capacitor 606 is coupled to the output terminal of the amplifier 126 via the feedback bus 122. Moreover, although not shown, it is contemplated that a select transistor of the first pixel 602 can be coupled to the read bus 120.

Likewise, the second pixel 604 includes a capacitor 608. Again, the capacitor 608 includes a first terminal and a second terminal (also referred to herein as a third terminal and a fourth terminal). The first terminal of the capacitor 608 is coupled to a floating diffusion region (not shown) of the second pixel 604 and the second terminal of the capacitor 608 is coupled to the output terminal of the amplifier 126 via the feedback bus 122. Further, although not shown, it is contemplated that a select transistor of the second pixel 604 can be coupled to the read bus 120.

While not shown, it is to be appreciated that other pixels in the same column as the pixel first 602 and the second pixel 604 can similarly be coupled to the read bus 120 and the feedback bus 122.

Figure 7:
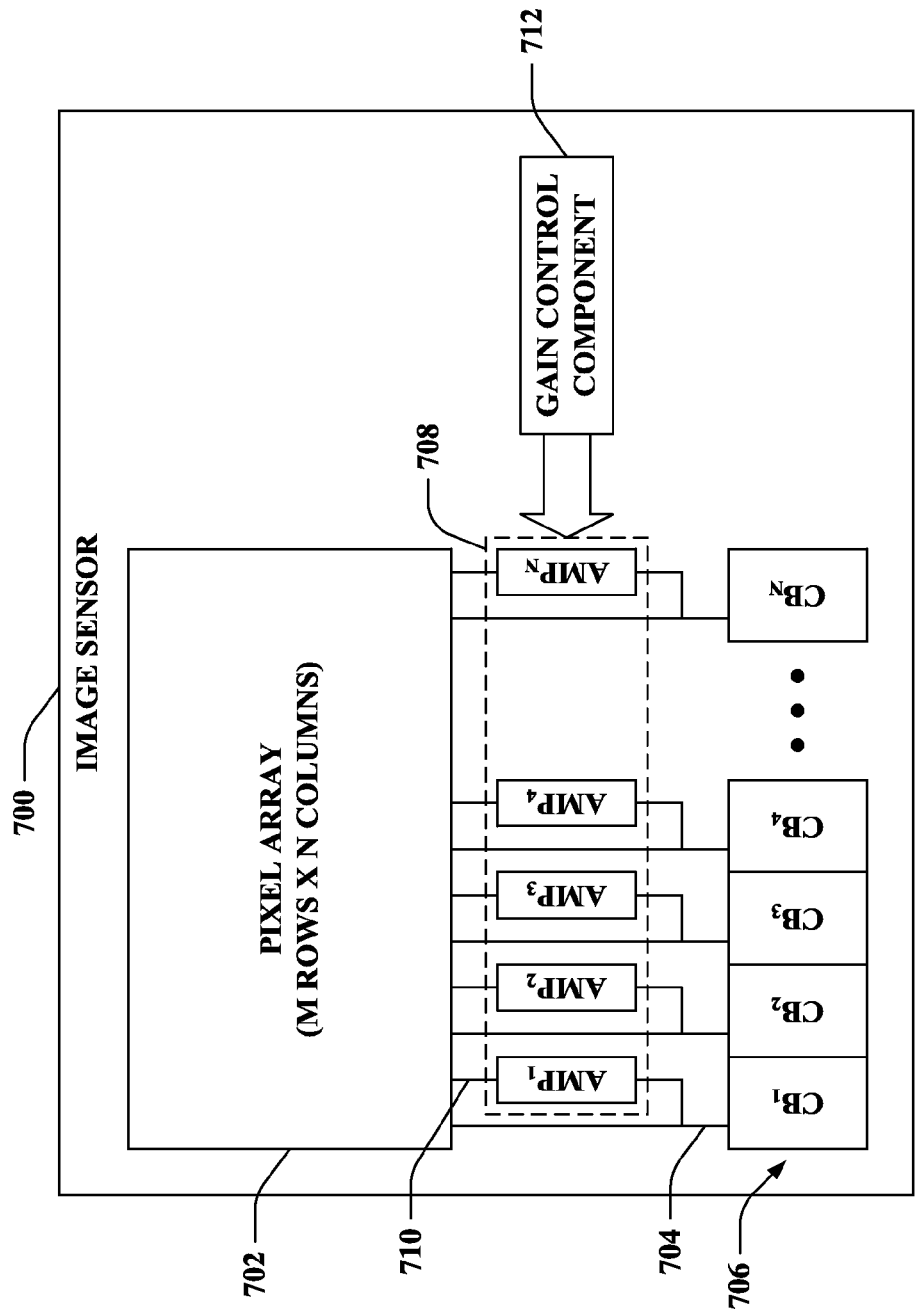
FIG. 7 illustrates another exemplary image sensor.

With reference to FIG. 7, illustrated is another exemplary image sensor 700. The image sensor 700 can be a CMOS image sensor system on chip. The image sensor 700 includes a pixel array 702. According to an example, a digital camera, a video camera (e.g., video conference camera, broadcast video camera cinematography camera, surveillance video camera, handheld video camera, camera integrated into a mobile phone, etc.), a video system, a medical imaging device, an industrial imaging device, a microscope, or the like can include the image sensor 700. It is contemplated that the image sensor 700 can include one or more of the image sensor 100 of FIG. 1, the image sensor 500 of FIG. 5, or the image sensor 600 of FIG. 6.

The pixel array 702 can include M rows and N columns of pixels, where M and N can be any integers. Each pixel in the pixel array 702 can include a photodetector (similar to the photodetector 104), a floating diffusion region (similar to the floating diffusion region 108), a source follower transistor (similar to the source follower transistor 110), a reset transistor (similar to the reset transistor 112), a select transistor (similar to the select transistor 114), and a capacitor (similar to the capacitor 118). The floating diffusion region of each pixel can have a respective intrinsic floating diffusion capacitance (similar to the intrinsic floating diffusion capacitance 116). Moreover, an equivalent capacitance of each pixel in the pixel array 702 can be adjusted as described herein. An image focused on the pixel array 702 can cause the pixels to convert incident light into electrical energy. Signals obtained by the pixel array 702 can be processed on a column by column basis; thus, a particular row of pixels from the pixel array 702 can be selected to be read during a given time period.

The image sensor 700 can further include a plurality of read buses (e.g., a read bus 704, etc.) that can transfer the contents from the pixels in the pixel array 702 in the selected row during the given time period. The read buses can each be substantially similar to the read bus 120 described herein. According to an illustration, the image sensor 700 can include N read buses, where each read bus can be associated with a respective column of the pixel array 702. By way of further example, pixels in the pixel array 702 can share read buses, and thus, the image sensor 700 can include fewer than N read buses. Pursuant to another illustration, each column of the pixel array 702 can be associated with more than one read bus; hence, the image sensor 700 can include more than N read buses.

Moreover, the image sensor 700 can include a plurality of column buffers 706 (e.g., substantially similar to the column buffer 124 described herein). In the example of FIG. 7, the image sensor 700 includes N column buffers 706 ($CB_1, \ldots, CB_N$); however, the claimed subject matter is not so limited. Output from a pixel included in a particular column of the pixel array 702 can be provided to a column buffer corresponding to the particular column (e.g., output from a pixel included in column 1 can be provided to $CB_1$ via the read bus 704, etc.). The column buffers 706 can amplify analog video information (e.g. signal) read out from the pixels in corresponding columns of the pixel array 702. According to an example, analog video information yielded from each pixel commonly can be memorized into a sampling capacitor (not shown) at an output of the column buffer corresponding to the column, digitized, further processed, manipulated, stored, etc.

Moreover, the image sensor 700 includes a plurality of amplifiers 708 (e.g., substantially similar to the amplifier 126, the amplifier 702, and/or the amplifier 704 described herein). According to the depicted example of FIG. 7, the image sensor 700 includes N amplifiers 708 ($AMP_1, \ldots,$ and $AMP_N$). Following this example, each column of pixels of the pixel array 702 can be associated with a corresponding amplifier from the plurality of amplifiers 708. Input terminals of the amplifiers 708 are each coupled to corresponding read buses (e.g., an input terminal of $AMP_1$ is coupled to the read bus 704, etc.).

The image sensor 700 further includes a plurality of feedback buses (e.g., a feedback bus 710, etc.). The feedback buses can each be substantially similar to the feedback bus 122 described herein. Moreover, output terminals of the amplifiers 708 can be coupled to respective feedback buses (e.g., an output terminal of $AMP_1$ can be coupled to the feedback bus 710, etc.).

The image sensor 700 can further include a gain control component 712 that can control gains of the amplifiers 708. As noted herein, the gains of the amplifiers 708 can be adjustable. Thus, the gain control component 712 can set the respective gains of the amplifiers 708 included in the image sensor 700. By setting the gains of the amplifiers 708, the gain control component 712 can control equivalent capacitances of floating diffusion regions of pixels included in the pixel array 702, which can in turn impact conversion gains of the pixels. Accordingly, conversion gains of the pixels of the pixel array 702 can be controlled as a function of the gains of the amplifiers 708 set by the gain control component 712. Thus, a conversion gain of a first pixel and a disparate conversion gain of a second pixel included in the pixel array 702 of the image sensor 700 can be controlled on a pixel-by-pixel basis as a function of the gains of the amplifiers 708 set by the gain control component 712 (e.g., within a frame different gains for the amplifiers 708 can be set by the gain control component 712).

For example, the gain control component 712 can separately control gains of each of the amplifiers 708. Thus, equivalent capacitances of floating diffusion regions of pixels can be controllable on a pixel-by-pixel basis. For instance, the pixel array 702 can include a first pixel and a second pixel, each of which can include a corresponding floating diffusion region. An equivalent capacitance of the floating diffusion region of the first pixel and an equivalent capacitance of the floating diffusion region of the second pixel can be controllable on a pixel-by-pixel basis based upon the gains of the amplifiers 708 controlled by the gain control component 712. Additionally or alternatively, the gain control component 712 can control the gains of the amplifiers 708 in combination.

According to an example, the gain control component 712 can automatically set the gain of an amplifier (e.g., based upon a default, in response to a sensed condition, etc.). According to another example, the gain control component 712 can set the gain of an amplifier responsive to user input. By way of yet another example, the gain control component 712 can set the gain of the amplifier responsive to input received from a device that comprises the image sensor 700 (e.g., from a camera that includes the image sensor 700, etc.). By way of illustration, when in a low light environment, the gain control component 712 can set the gains of the amplifiers 708 for operation in a low-light mode. Further following this illustration, when in a bright environment, the gain control component 712 can set the gains of the amplifiers 708 for operation in a dynamic range mode.

Figure 8:
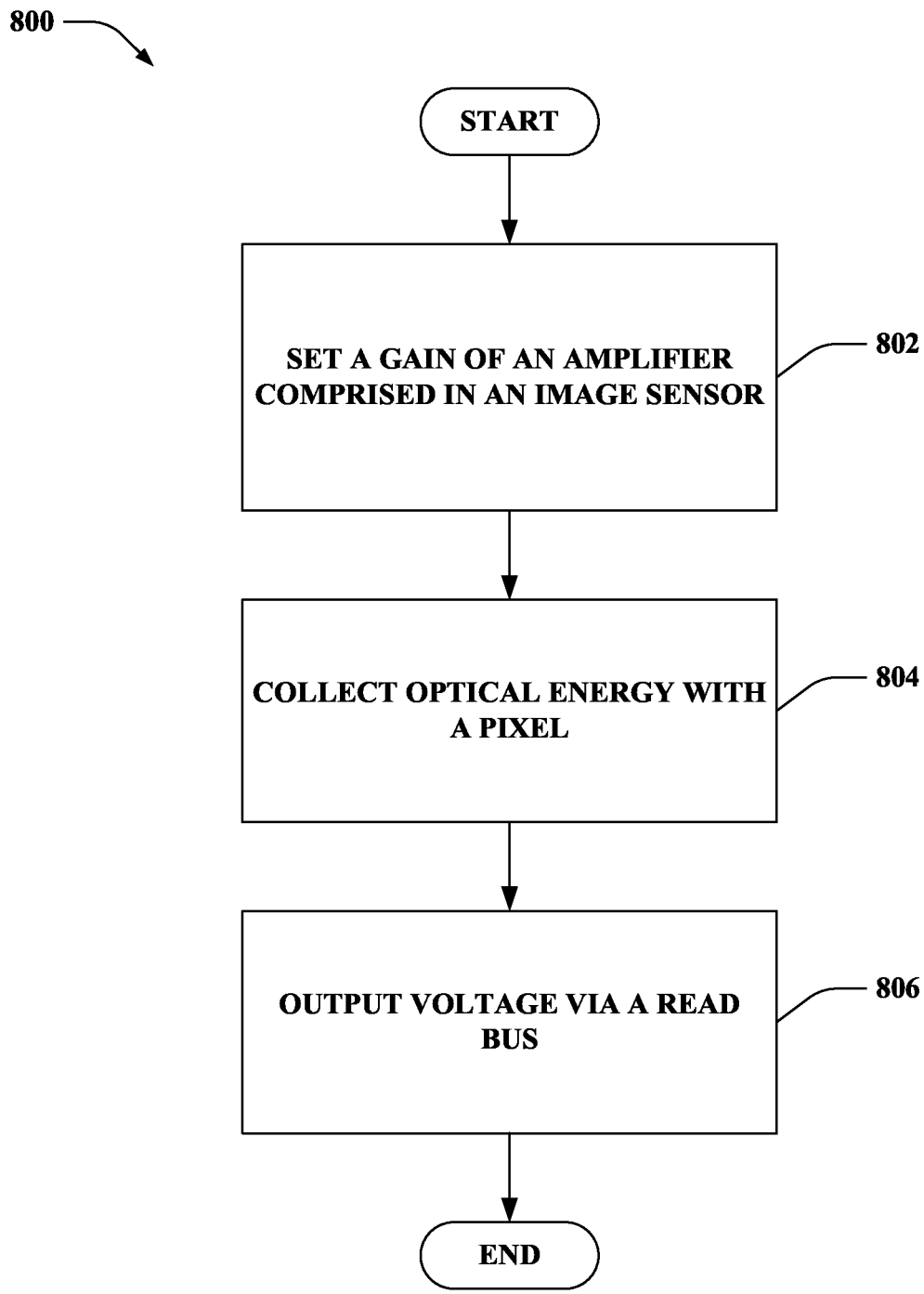
FIG. 8 is a flow diagram that illustrates an exemplary methodology of controlling conversion gain of a pixel included in a pixel array of an image sensor.

FIG. 8 illustrates an exemplary methodology relating to control of conversion gain of a pixel. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement a methodology described herein.

The acts described herein may be implemented by an image sensor or an image signal processor. Moreover, the acts described herein may be computer-executable instructions that can be implemented by one or more processors and/or stored on a computer-readable medium or media. The computer-executable instructions can include a routine, a sub-routine, programs, a thread of execution, and/or the like. Still further, results of acts of the methodology can be stored in a computer-readable medium, displayed on a display device, and/or the like.

FIG. 8 illustrates a methodology 800 of controlling conversion gain of a pixel included in a pixel array of an image sensor. At 802, a gain of an amplifier comprised in an image sensor can be set. The gain of the amplifier can be adjustable. The amplifier can include an input terminal coupled to a read bus of the image sensor. The amplifier can further include an output terminal coupled to a capacitor comprised in the pixel, where the capacitor is further coupled to a floating diffusion region of the pixel. At 802, optical energy can be collected with the pixel. The optical energy can be converted by the pixel to a voltage based upon the conversion gain, where the conversion gain can be a function of the gain of the amplifier. According to various examples, it is contemplated that the gain of the amplifier can be dynamically altered, which can cause a corresponding adjustment to the conversion gain. At 806, the voltage can be output via the read bus.

Figure 9:
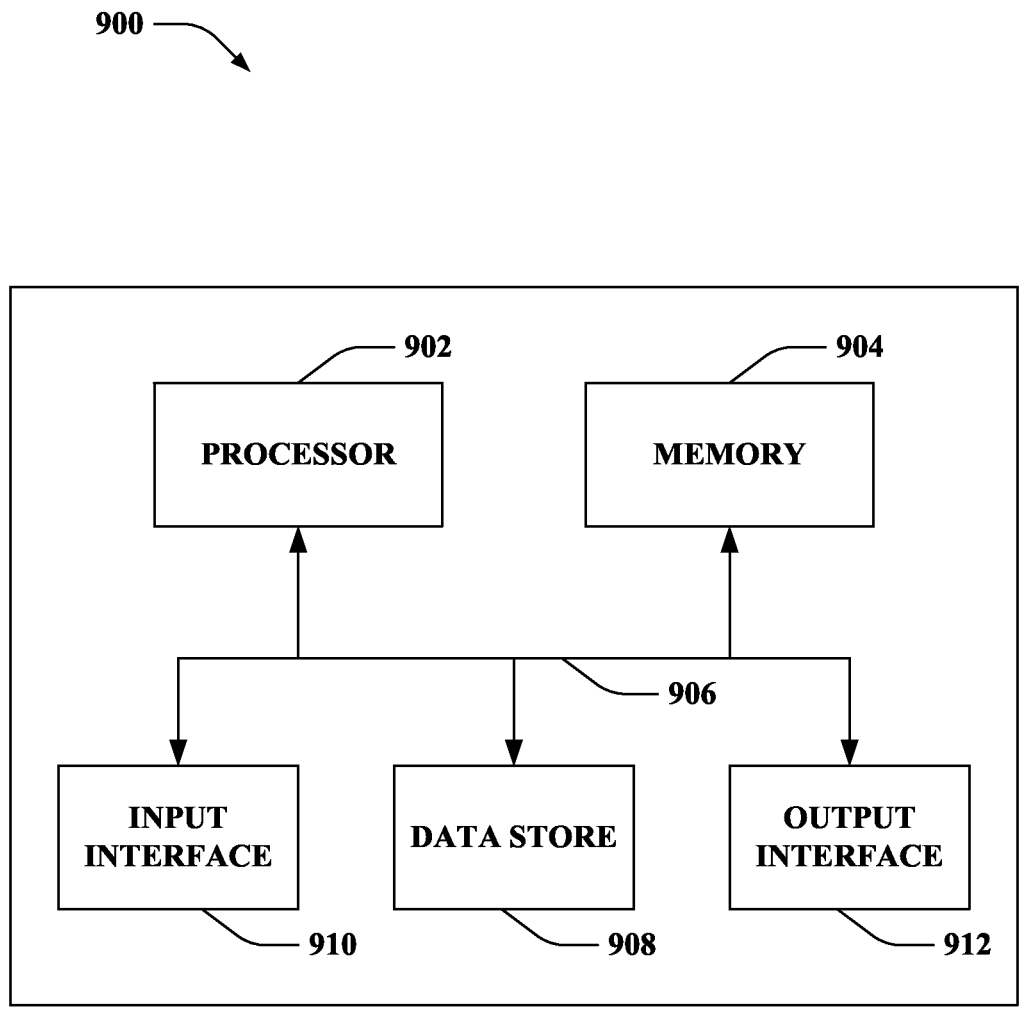
FIG. 9 illustrates an exemplary computing device.

Referring now to FIG. 9, a high-level illustration of an exemplary computing device 900 that can be used in accordance with the systems and methodologies disclosed herein is illustrated. For instance, the computing device 900 may employ an image sensor. According to another, one or more components of the computing device 900 can be integrated in an image sensor. The computing device 900 includes at least one processor 902 that executes instructions that are stored in a memory 904. The processor 902 may access the memory 904 by way of a system bus 906.

The computing device 900 additionally includes a data store 908 that is accessible by the processor 902 by way of the system bus 906. The data store 908 may include executable instructions, etc. The computing device 900 also includes an input interface 910 that allows external devices to communicate with the computing device 900. For instance, the input interface 910 may be used to receive instructions from an external computer device, from a user, etc. The computing device 900 also includes an output interface 912 that interfaces the computing device 900 with one or more external devices. For example, the computing device 900 may display text, images, etc. by way of the output interface 912.

Additionally, while illustrated as a single system, it is to be understood that the computing device 900 may be a distributed system. Thus, for instance, several devices may be in communication by way of a network connection and may collectively perform tasks described as being performed by the computing device 900.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices.

Further, as used herein, the term "exemplary" is intended to mean "serving as an illustration or example of something."

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. An image sensor, comprising:
   a read bus;
   a pixel array that comprises a pixel, the pixel comprising:
      a photodetector that converts optical energy to electrical charge;
      a floating diffusion region that receives the electrical charge from the photodetector, wherein the floating diffusion region has an intrinsic floating diffusion capacitance;
      a source follower transistor coupled to the floating diffusion region;
      a select transistor coupled to the source follower transistor, wherein the select transistor is further coupled to the read bus; and
      a capacitor that comprises a first terminal and a second terminal,
   wherein the first terminal is coupled to the floating diffusion region; and
   an amplifier that comprises an input terminal and an output terminal, wherein the input terminal is coupled to the read bus and the output terminal is coupled to the second terminal of the capacitor.

2. The image sensor of claim 1, wherein the pixel further comprises a transfer transistor coupled to the photodetector, wherein the transfer transistor is further coupled to the floating diffusion region.

3. The image sensor of claim 1, wherein the photodetector is coupled to the floating diffusion region.

4. The image sensor of claim 1, wherein a gain of the amplifier is adjustable.

5. The image sensor of claim 1, wherein an equivalent capacitance of the floating diffusion region varies as a function of a gain of the amplifier.

6. The image sensor of claim 1, wherein an equivalent capacitance of the floating diffusion region is changeable in a range between a low capacitance and a high capacitance, wherein the low capacitance is below the intrinsic floating diffusion capacitance and the high capacitance is above the intrinsic floating diffusion capacitance.

7. The image sensor of claim 1, wherein the pixel array further comprises a second pixel, wherein the second pixel comprises a second floating diffusion region, and wherein an equivalent capacitance of the floating diffusion region of the pixel and a second equivalent capacitance of the second floating diffusion region of the second pixel are controllable on a pixel-by-pixel basis.

8. The image sensor of claim 1, wherein the pixel array further comprises a second pixel, wherein the pixel and the second pixel are both in a given column within the pixel array, and wherein the second pixel comprises:
   a second photodetector that converts optical energy to electrical charge;
   a second floating diffusion region that receives the electrical charge from the second photodetector;
   a second source follower transistor coupled to the second floating diffusion region;
   a second select transistor coupled to the second source follower transistor, wherein the second select transistor is further coupled to the read bus; and
   a second capacitor that comprises a third terminal and a fourth terminal, wherein the third terminal is coupled to the second floating diffusion region, and wherein the fourth terminal is coupled to the output terminal of the amplifier.

9. The image sensor of claim 1, further comprising:
   a second read bus; and
   a second amplifier that comprises a second input terminal and a second output terminal, wherein the second input terminal is coupled to the second read bus;
   wherein the pixel array further comprises a second pixel, wherein the pixel and the second pixel are in differing columns within the pixel array, and wherein the second pixel comprises:
      a second photodetector that converts optical energy to electrical charge;
      a second floating diffusion region that receives the electrical charge from the second photodetector;
      a second source follower transistor coupled to the second floating diffusion region;
      a second select transistor coupled to the second source follower transistor, wherein the second select transistor is further coupled to the second read bus; and
      a second capacitor that comprises a third terminal and a fourth terminal, wherein the third terminal is coupled to the second floating diffusion region, and wherein the fourth terminal is coupled to the second output terminal of the second amplifier.

10. The image sensor of claim 1, further comprising a gain control component that sets a gain of the amplifier to control an equivalent capacitance of the floating diffusion region.

11. The image sensor of claim 10, wherein the gain control component sets the gain of the amplifier responsive to input received from a device that comprises the image sensor.

12. A pixel included in a pixel array of an image sensor, comprising:
   a photodetector that converts optical energy to electrical charge;
   a floating diffusion region that receives the electrical charge from the photodetector;
   a source follower transistor coupled to the floating diffusion region;
   a select transistor coupled to the source follower transistor, wherein the select transistor is further coupled to a read bus of the image sensor, and wherein an input terminal of an amplifier of the image sensor is coupled to the read bus; and
   a capacitor that comprises a first terminal and a second terminal, wherein the first terminal is coupled to the floating diffusion region, and wherein the second terminal is coupled to an output terminal of the amplifier.

13. The pixel of claim 12, wherein the pixel further comprises a transfer transistor coupled to the photodetector, wherein the transfer transistor is further coupled to the floating diffusion region.

14. The pixel of claim 12, wherein the photodetector is coupled to the floating diffusion region.

15. A method of controlling conversion gain of a pixel included in a pixel array of an image sensor, comprising:
   setting a gain of an amplifier comprised in the image sensor, wherein the gain of the amplifier is adjustable, wherein the amplifier comprises an input terminal coupled to a read bus of the image sensor, wherein the amplifier further comprises an output terminal coupled to a capacitor comprised in the pixel, and wherein the capacitor is further coupled to a floating diffusion region of the pixel;
   collecting optical energy with the pixel, wherein the optical energy is converted by the pixel to a voltage based upon the conversion gain, wherein the conversion gain is a function of the gain of the amplifier; and
   outputting the voltage via the read bus.

16. The method of claim 15, further comprising automatically setting the gain of the amplifier.

17. The method of claim 15, further comprising setting the gain of the amplifier responsive to user input.

18. The method of claim 15, further comprising setting the gain of the amplifier responsive to input received from a device that comprises the image sensor.

19. The method of claim 15, further comprising controlling an equivalent capacitance of the floating diffusion region as a function of the gain of the amplifier, wherein the equivalent capacitance of the floating diffusion region is variable in a range between a low capacitance and a high capacitance, wherein the low capacitance is below an intrinsic floating diffusion capacitance and the high capacitance is above the intrinsic floating diffusion capacitance.

20. The method of claim 15, wherein the conversion gain of the pixel and a disparate conversion gain of a disparate pixel included in the pixel array of the image sensor are controlled on a pixel-by-pixel basis.

* * * * *